United States Patent
Wann et al.

[11] Patent Number: 5,811,343
[45] Date of Patent: *Sep. 22, 1998

[54] OXIDATION METHOD FOR REMOVING FLUORINE GAS INSIDE POLYSILICON DURING SEMICONDUCTOR MANUFACTURING TO PREVENT DELAMINATION OF SUBSEQUENT LAYER INDUCED BY FLUORINE OUTGASSING DIELECTRIC

[75] Inventors: Yeh-Jye Wann; An-Min Chiang, both of Hsin-Chu; Shaun-Tsung Yu, Taipei; Pei-Hung Chen, Hsin-Chu, all of Taiwan

[73] Assignee: Taiwan Semiconductor Manufacturing Company, Ltd., Hsin-Chu, Taiwan

[*] Notice: This patent issued on a continued prosecution application filed under 37 CFR 1.53(d), and is subject to the twenty year patent term provisions of 35 U.S.C. 154(a)(2).

[21] Appl. No.: 683,645

[22] Filed: Jul. 15, 1996

[51] Int. Cl.⁶ .................................................. H01L 21/265
[52] U.S. Cl. ........................ 438/305; 438/761; 438/532
[58] Field of Search ................................ 437/18, 20, 29, 437/28, 34, 950, 40 AS, 56, 57, 239, 98.3, 41; 438/305, 532, 510, 514, 515, 920, 976, 530, 533, 761, 762, 763, 778, 554, 227, 228, 494, 152, 154, 162, 163, 174, 489

[56] References Cited

U.S. PATENT DOCUMENTS

| | | | |
|---|---|---|---|
| 5,021,358 | 6/1991 | Flanner et al. | 437/57 |
| 5,132,241 | 7/1992 | Su | 438/451 |
| 5,225,357 | 7/1993 | Ho | 437/950 |
| 5,244,821 | 9/1993 | Ham et al. | 438/520 |
| 5,266,510 | 11/1993 | Lee | 437/52 |
| 5,405,791 | 4/1995 | Ahmad et al. | 437/34 |
| 5,407,847 | 4/1995 | Hayden et al. | 438/564 |
| 5,434,096 | 7/1995 | Chu et al. | 438/592 |
| 5,460,993 | 10/1995 | Hsu et al. | 437/56 |
| 5,502,009 | 3/1996 | Lin | 438/275 |
| 5,504,031 | 4/1996 | Hsu et al. | 437/34 |
| 5,563,104 | 10/1996 | Janu et al. | 438/761 |
| 5,599,726 | 2/1997 | Pan | 437/29 |
| 5,707,896 | 1/1998 | Chiang et al. | 438/660 |

FOREIGN PATENT DOCUMENTS

| | | | |
|---|---|---|---|
| 63-21825 | 1/1988 | Japan . | |
| 363056916 A | 3/1988 | Japan . | |
| 1-232718 A | 9/1989 | Japan . | |
| 3-148814 A | 6/1991 | Japan | 437/950 |
| 4-101421 A | 4/1992 | Japan . | |
| 93-038346 | 2/1993 | Japan | 437/950 |
| 5-90293 | 4/1993 | Japan | 437/950 |
| 6-163576 A | 6/1994 | Japan | 437/950 |

OTHER PUBLICATIONS

S. Wolf, "Silicon Processing for the VLSI Era–vol. 3" Lattice Press, Sunset Beach, CA. pp. 308, 346, 347 no date.

*Primary Examiner*—John Niebling
*Assistant Examiner*—S. Mulpuri
*Attorney, Agent, or Firm*—George O. Saile; Stephen B. Ackerman; Graham S. Jones, II

[57] ABSTRACT

A method for manufacturing integrated circuit semiconductor device is provided for doping polysilicon formed on an N-well in a semiconductor substrate. Form a silicon oxide layer on the N-well. Then form a blanket polysilicon layer over the silicon oxide layer and pattern the polysilicon layer into a structure. Form a sacrificial oxide layer over the polysilicon structure. Then ion implant $^{49}(BF_2)^+$ ions into the N-well and the polysilicon layer forming the source/drain regions and doping the polysilicon layer with P-type dopant thereby forming a doped polysilicon layer from the polysilicon layer. Then etch the sacrificial oxide layer away from the device. Form a polyoxide layer over the polysilicon structure. Then form a silicon oxide layer over the polyoxide layer followed by forming a glass layer thereover.

3 Claims, 6 Drawing Sheets

OXIDATION METHOD FOR REMOVING FLUORINE GAS INSIDE POLYSILICON DURING SEMICONDUCTOR MANUFACTURING TO PREVENT DELAMINATION OF SUBSEQUENT LAYER INDUCED BY FLUORINE OUTGASSING DIELECTRIC

BACKGROUND OF THE INVENTION

1. Field of the Invention

This invention relates to semiconductor devices and more particularly to improved methods of manufacturing of doped polysilicon structures in such devices.

2. Description of Related Art

In the manufacture of semiconductor devices source and drain regions are formed by self-aligned source/drain implantation. The source/drain self-aligned implantation method used is to form the source/drain comprises ion implanting boron fluoride $49_{(BF2)}{}^+$ ions into the source/drain regions, as well as, the polysilicon. When the boron fluoride ions are implanted, as the molecule collides with the polysilicon, it is broken down into individual atoms of fluorine and boron. Combining boron with fluorine lowers the kinetic energy of the boron atoms when they are released. However, the smaller boron atoms have an atomic weight of about 10.81 and the larger fluorine atoms have a greater atomic weight of about 18.99. In spite of the greater atomic weight and greater mass which leads to a higher kinetic energy, the fluorine atoms distribution is shallower than the boron atoms. In addition, the fluorine atoms create greater lattice damage. The fluorine remains in the device as an unnecessary and unwanted byproduct which is embedded in the semiconductor device. Doping with boron fluoride has caused some problems as follows:

(1) There has been a problem of Dielectric layer peeling which occurs only with polysilicon gate-electrodes ion implanted with P+ $^{49}(BF_2)^+$ ions.

(2) X'TEM (Cross-Section Transmission Electron Microscopy) data revealed existence of a delamination region between the gate-electrode and the dielectric layer.

For example in a prior design considered, a 1 μm mix-mode sample produced, which were tested including a capacitor have had a buffered BPTEOS (BoroPhosphoTetraEthylOrthoSilicate) bubble defect which occurs only in the PMOS area. A BPTEOS film comprises a 1000 Å thick film of undoped USG Glass plus 5000 Å doped BPSG (Boro-PhosphoSilicate Glass) as well as 200 Å polyoxide and 400 Å silicon nitride layers.

FIG. 1 shows a plan view of a semiconductor circuit including a device PMOS the defect of a bubble B is shown on the circuit to the right of the device PMOS. A section line 2-2' passes through the bubble B.

FIG. 2 is a sectional view taken along line 2—2 of the device of FIG. 1 illustrating the problem that there is the bubble B seen in FIG. 1.

A device 10 comprises a N-well in a silicon semiconductor substrate. The N-well has a field oxide (FOX) region 16 formed therein on the right with a gate oxide layer 18 formed on the surface of substrate 12 to the left of FOX region 16 with a polysilicon layer 20 formed over gate oxide layer 18 and a portion of FOX region 16. Above the polysilicon layer 20 is seen a bubble B in region 22 with an interface 30 between polysilicon oxide and polysilicon. Above the bubble region 22 and FOX region as well as a portion of polysilicon layer 20 is formed polyoxide layer 24' and a silicon nitride layer 24. A TEOS layer 28 is formed above the silicon nitride layer 24. Above the BPTEOS layer 26 is formed a silicon oxide layer 28 composed of an $O_3$-TEOS material comprising an ILD layer.

The process flow of the method employed to produce the device of FIG. 2 is as follows:

METHOD I

A. Patterning of polysilicon layer.

B. N+/P+ Ion Implantation of $^{49}(BF_2)^+$ ions.

C. Formation of dielectric layer over polysilicon layer.

After step C, the concentration of the boron dopant in polysilicon layer 20 ranges from about 1.4 E 20 atoms/cm$^3$ to about 1.7 E 21 atoms/cm$^3$ and the concentration of the fluorine atoms in the polysilicon layer 20 ranges from about 2.8 E 20 atoms/cm$^3$ to about 3.4 E 21 atoms/cm$^3$, so evolution of fluorine gas from the layer 20 during subsequent manufacturing steps causes damage to the device 10.

Wolf states at p. 308 that approaches for reducing "the depth of the as-implanted boron region in the channel of PMOS devices . . . apply to reducing the source/drain junction depths. These include use of BF2+ ions instead of atomic boron as the implant species, and implanting through a screen oxide . . . ", Wolf, "Silicon Processing for the VLSI Era" Volume 3: "The Submicron MOSFET, PAGE 308 SILICON PROCESSING FOR THE VLSI ERA-VOLUME III. While the above technique uses a screen oxide to prepare for pre-amorphizing (preparing to form an amorphous layer) to prevent a channeling effect and to form shallow junction, we have found that the practice in the art is that the screen oxide remains at the source/drain area, i.e. the screen oxide layer is not removed.

Later referring to Wolf, VOLUME III, pages 346–347, it is stated as follows:

"6.2.1.10 Regrow Sacrificial Pad Oxide and Strip (Kooi Effect)."

"During the growth of the field oxide, another phenomenon occurs that can cause defects later when the gate oxide is grown. Kooi et al., discovered that a thin layer of silicon nitride can form on the silicon surface (i.e., at the pad-oxide/silicon interface) close to the border of the active regions, as a result of the reaction between the oxidizing species ($O_2$ or $H_2O$) and the silicon nitride . . . That is, $NH_3$ (or some other NH compound or nitrogen) is generated from the reaction between $H_2O$ and the masking nitride during the field-oxidation step. This $NH_3$ then diffuses through the oxide and reacts with the silicon substrate to form silicon-nitride spots or ribbon (these regions are also sometimes called white ribbon because they have this appearance when viewed under an optical microscope due to light scattering . . . Under the field oxide the reaction of $NH_3$ with Si would not be very effective due to competition with the oxidation reaction of $H_2O$ with Si. However, at some distance from the field oxide edge, under the nitride mask, the concentration of $H_2O$ might be assumed to be low enough to allow an effective nitridation reaction to occur. This would allow some silicon nitride (or possibly, silicon oxynitride with oxidation masking capability), to form. Direct observation of this masking layer by transmission electron microscopy has also been reported . . .

"When the nitride mask and pad oxide layer are removed, there is a possibility that the nitride ribbon would remain present. When the gate oxide is subsequently grown, the growth rate becomes impeded at the locations where such silicon nitride remains. The gate oxide is thus thinner at these locations than elsewhere . . . giving rise to problems of low-voltage breakdown of the gate oxide. One way to overcome this problem would be to etch the pad oxide long enough to also ensure that the ribbon is removed. Unfortunately, too much field oxide is removed at the same time."

"Instead, the most widely used method to eliminate the white ribbon problem is to grow a "sacrificial" oxide (typically 25–50 nm thick) after stripping the masking nitride and pad oxide. This sacrificial oxide layer is removed by wet etching before growing the final gate oxide . . . The chemical removal of the sacrificial oxide will again consume part of the field oxide and, as noted above, must likewise be optimized."

"A double sacrificial-oxide process has also been reported. Its benefit is a smoother active-area silicon surface on which the final gate oxide is grown. This results in smaller gate leakage currents (due to the onset of Fowler-Nordheim tunneling at higher fields), a lower interface state density, and a lower gate-oxide defect density . . . "

Use an additional sacrificial oxide layer to "trap" mostly "F" of $BF_2^+$ Implant. Then, remove the sacrificial oxide layer in an oxide removal step to eliminate "F" fluorine outgassing induced delamination of subsequent layer.

While the discussion at pages 346–347 is directed to solving a gate oxide local thinning issue (white ribbon problem) in the gate oxide. That is an entirely different and unrelated problem from the problem solved by the present invention. The problem discussed at pages 346–347 occurs at an entirely different and earlier part of the process of manufacture of a semiconductor device before the formation of the polysilicon layer which does not relate to bubbles being formed and which does not result in delamination.

The problem to be solved by this invention is to eliminate and avoid delamination of a layer deposited subsequently to a deposition of a polysilicon layer. Such delamination is induced by outgassing of fluorine gas (F) after boron doping of polysilicon by ion implantation with boron fluoride. While implanting polysilicon with boron fluoride has the advantages of formation of a shallow junction, it has the side effect of undesirable deposition of fluorine atoms into the device. During subsequent processing, the fluorine in the device is dislodged and the fluorine atoms evolve into fluorine gas which leads to formation of bubbles and delamination of a subsequent CA layer formed above the polysilicon layer from which the fluorine gas is evolving.

In summary:
1) CA layer peeling only occurred on P+ $^{49}(BF_2)^+$ implanted Gate-electrode.
2) X'TEM data revealed that delamination happens between the gate-electrode polysilicon layer and the capacitor (CA) layer.

SUMMARY OF THE INVENTION

Glossary

BOE Buffered Oxide Etchant
BPSG BoroPhosphoSilicate Glass
BPTEOS Glass BoroPhosphoTetraEthylOrthoSilicate glass
CA Dielectric layer: Polyoxide & $Si_3N_4$
Polyoxide Silicon dioxide film grown on a polysilicon layer by thermal oxidation.
SAC-OX SACrificial silicon diOXide
TEOS TetraEthylOrthoSilicate $Si(OC_2H_5)_4$ In accordance with this invention, over a polysilicon layer which is to be doped, a thin silicon dioxide layer is grown which thin layer acts as a screen oxide and a polyoxide layer. The screen layer can be a SAC-OX layer. During a following step of ion implantation with $^{49}(BF_2)^+$ dopant, the SAC-OX layer becomes a fluorine rich layer. Then in an etching steps, such as BOE oxide removal step, remove the screen oxide layer after N+ and P+ implantation. This extra removal of oxide which eliminates dielectric delamination of a subsequent layer caused by outgassing of fluorine gas, since the fluorine gas has been removed.

Subsequent layers can comprise polyoxide and silicon nitride ($Si_3N_4$) layers.

An object of this invention is to eliminate fluorine gas outgassing induced delamination of layers formed over a doped polysilicon layer which was doped by ion implanting with $^{49}(BF_2)^+$ ions. Outgassing, in this case, refers to unwanted evolution of loss of occluded gases, which have become trapped in the solid layers of the device.

In accordance with this invention, a method for manufacturing integrated circuit semiconductor device is provided including the following steps. Provide a semiconductor N-well with an N-well therein. Form a silicon oxide layer on the N-well. Form a blanket polysilicon layer over the silicon oxide layer and patterning the polysilicon layer to form a polysilicon structure. Form a sacrificial layer over the polysilicon layer. Ion implant $^{49}(BF_2)^+$ ions into the polysilicon layer and into the N-well self-aligned with the patterned polysilicon structure and to dope the polysilicon layer with P-type dopant thereby forming doped regions in the N-well and doping the polysilicon structure. Etch the sacrificial layer away from the device.

Preferably, a material selected from the group consisting of polyoxide and silicon nitride is formed over the doped polysilicon layer, and the boron fluoride $^{49}(BF_2)^+$ dopant is ion implanted at an energy from about 60 keV to about 80 keV of from about 1 E 15 ions/cm$^2$ to about 5 E 15 ions/cm$^2$.

In another aspect of the invention, the sacrificial layer over the polysilicon layer comprises a polyoxide layer formed by thermal oxidation. Then the boron fluoride $^{49}(BF_2)^+$ dopant is ion implanted at an energy from about 60 keV to about 80 keV of from about 1 E 15 ions/cm$^2$ to about 5 E 15 ions/cm$^2$.

Preferably, the sacrificial layer is formed by thermal oxidation with oxygen with the range of parameters of an oxygen flow from about 5 l/m to about 10 l/m and at a temperature from about 850° C. to about 920° C.

Preferably, the concentration of the boron dopant in the polysilicon layer ranges from about 1.4 E 20 atoms/cm$^3$ to about 1.7 E 21 atoms/cm$^3$ and the concentration of the fluorine atoms in the polysilicon layer ranges from about 2.8 E 20 atoms/cm$^3$ to about 3.4 E 21 atoms/cm$^3$, and before etching the sacrificial layer polysilicon oxide away the concentration of the boron dopant in the polysilicon oxide ranges from about 1.4 E 20 atoms/cm$^3$ to about 1.7 E 21 atoms/cm$^3$ and the concentration of the fluorine atoms in the polysilicon oxide layer ranges from about 2.8 E 20 atoms/cm$^3$ to about 3.4 E 21 atoms/cm$^3$.

In accordance with another aspect of this invention, an integrated circuit semiconductor device includes a semiconductor N-well, a silicon oxide layer on the N-well, and a polysilicon structure over the silicon oxide layer.

Preferably, the polysilicon structure has been ion implanted with $^{49}(BF_2)^+$ ions to dope the polysilicon structure with P-type dopant thereby forming a doped polysilicon structure from the polysilicon structure, with doped source/drain regions self-aligned with the polysilicon structure. The concentration of the boron dopant in the polysilicon structure ranges from about 1.4 E 21 atoms/cm$^3$ to about 1.7 E 21 atoms/cm$^3$ and the concentration of the fluorine atoms in the polysilicon structure ranges from about 2.8 E 21 atoms/cm$^3$ to about 3.4 E 21 atoms/cm$^3$. An undoped capacitor dielectric layer is formed over the doped N-well and the polysilicon structure.

Preferably, the capacitor dielectric layer is composed a material selected from the group consisting of polyoxide and silicon nitride. The layer of silicon nitride is formed over the capacitor dielectric layer. The polysilicon structure has a thickness from about 1500 Å to about 4000 Å. The capacitor dielectric layer is composed of polyoxide. A silicon nitride layer is formed over the capacitor dielectric layer. Glass is formed over the silicon nitride layer.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

We have found that the problem of bubble delamination between the gate electrode polysilicon layer and the overlying dielectric layer, which is described above, can be overcome by the formation of an additional SAC-OX layer over the polysilicon layer (such as a gate electrode layer) prior to the step of ion implantation. Next the step of ion implantation into the gate electrode polysilicon layer proceeds in the conventional manner. Following the ion implantation step, a step of wet or dry etching (such as a BOE (Buffered Oxide Etchant) NH$_4$F+HF in H$_2$O wet etching solution is performed to remove the SAC-OX layer subsequent to the step of ion implantation thereby removing the fluorine (F) rich SAC-OX layer to eliminate delamination of the dielectric layer.

The process flow of the modified and improved method is as follows:

METHOD II

A. Patterning of polysilicon layer

B. Polysilicon oxidation: Grow SAC-OX layer over polysilicon layer

C. N+/P+ Ion Implantation of $^{49}(BF_2)^+$ Ions

D. Dry or wet etch for oxide removal of SAC-Ox layer

E. Formation of dielectric layer over polysilicon layer.

SUMMARY

Additional steps of polysilicon oxidation and etching in a wet or dry etching step for removal of the SAC-OX layer. This has the advantage that the fluoride (F) rich layer is removed early in the process thereby eliminating delamination of the dielectric layer.

Two additional steps are added to the process of formation of a SAC-OX layer over the polysilicon layer, followed by a step of etching with a dry or wet, e.g. a BOE etch, oxide removal to remove the F- rich layer. Such etching can eliminate delamination of the dielectric layer. The BOE etchant comprises NH$_4$F (ammonium fluoride) plus an aqueous solution of hydrogen fluoride (HF in H$_2$O).

FIGS. 3A–3E shows the steps of fabrication of a device 30 in accordance with this invention.

Figure 1:
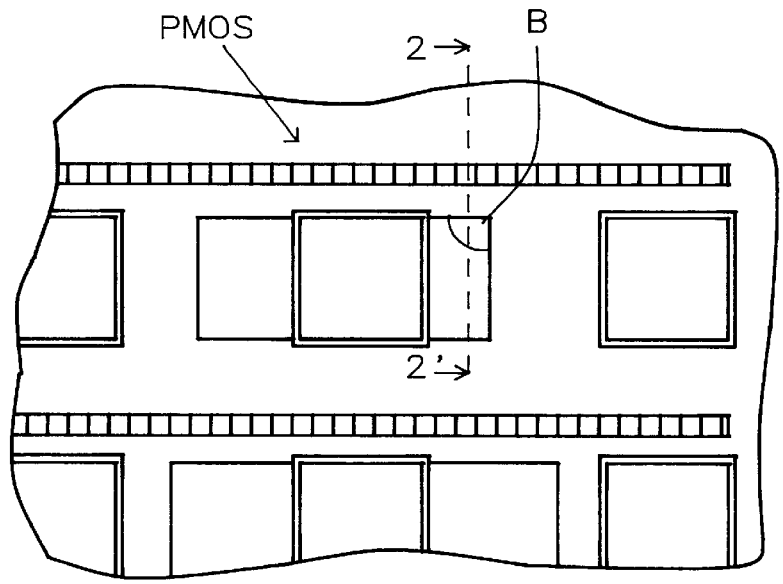
FIG. 1 shows a plan view of a semiconductor circuit including a device PMOS the defect of a bubble is shown on the circuit to the right of the device PMOS. A section line 2-2' passes through the bubble which presents a problem solved by the process of FIGS. 3A–3E and FIGS. 4A–4E.
Figure 2:
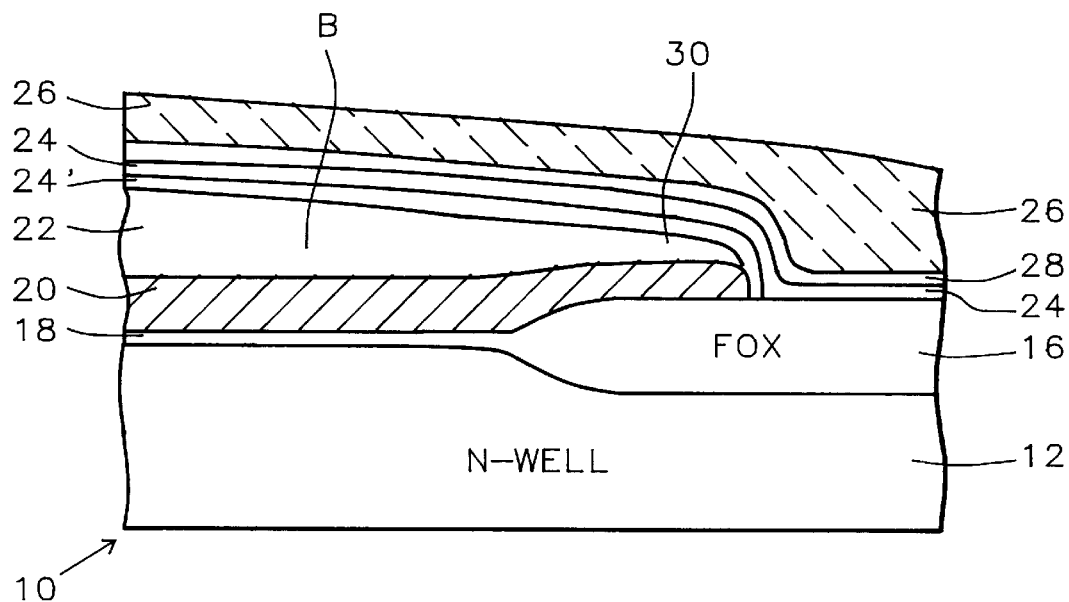
FIG. 2 is a sectional view taken along line 2—2 of the device of FIG. 1 illustrating the problem that there is the bubble B seen in FIG. 1.
Figure 3A:
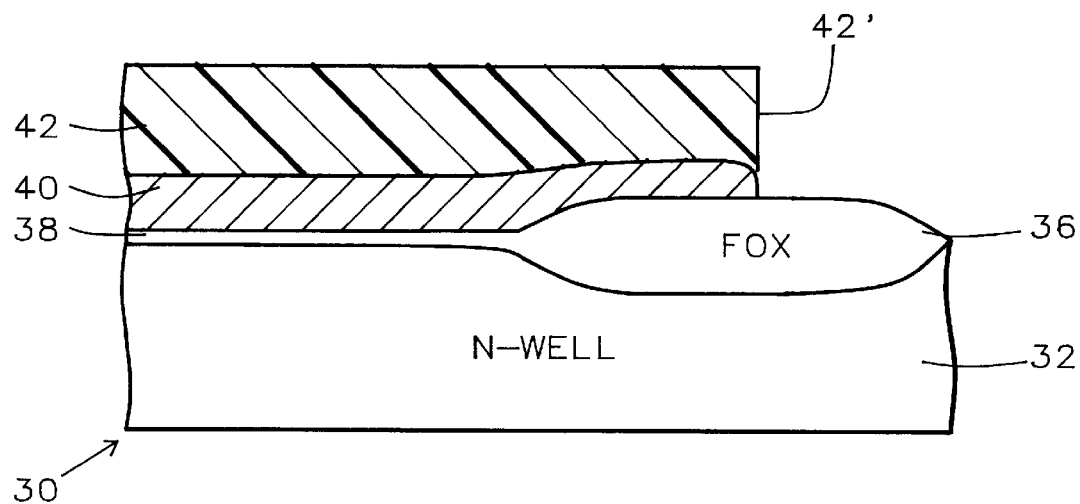
FIGS. 3A–3E show sectional views of the steps of fabrication of a device in accordance with this invention.

FIG. 3A shows device 30 in an early stage of manufacture with a N-well 32 in the substrate upon the surface of which a gate oxide layer 38 and a field oxide (FOX) region 36 are formed. A blanket layer of polycrystalline silicon (polysilicon) 40 has been formed over the device and a photoresist mask 42 with an opening 42' is shown over the layer 40. The layer 40 has been etched to form the pattern desired. Layer 40 has a thickness from about 1500 Å to about 4000 Å.

Figure 3B:
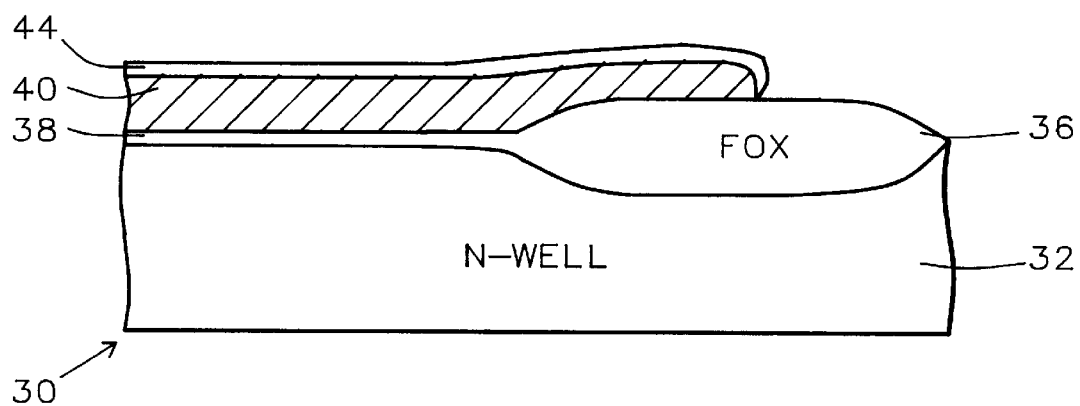

FIGS. 3B shows the device 30 of FIG. 3A after the mask 42 has been stripped from device 30, which is shown after formation of a SAC-OX layer 44 in accordance with this invention which covers the layer 40 and extends over the edge of layer 40 down to the surface of FOX region 36. Layer 44 has a thickness from about 100 Å to about 300 Å.

The SAC-OX layer 44 was formed by a process of thermal oxidation with the range of parameters of 5 l/m to 100 l/m at a temperature from about 850° C. to about 920° C. in a thermal tube at atmospheric pressure.

Figure 3C:
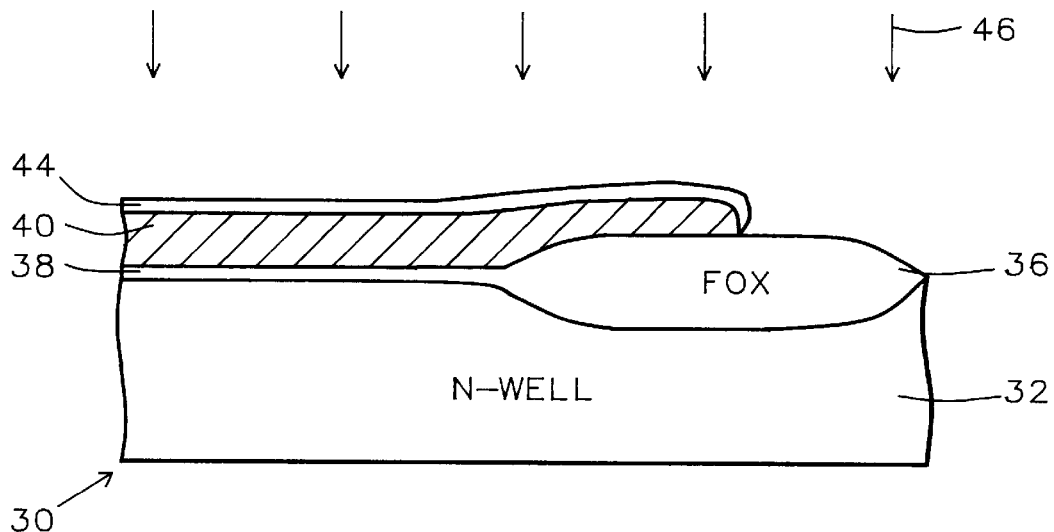

FIG. 3C shows the device 30 of FIG. 3B during the source/drain ion implantation process, with the polysilicon layer 40 and the SAC-OX layer 44 being ion implanted with P-type dopant with a dose of ions of boron fluoride $^{49}(BF_2)^+$ dopant 46. The process of ion implantation is performed at an energy from about 60 keV to about 80 keV of from about 1 E 15 ions/cm$^2$ to about 5 E 15 ions/cm$^2$.

Figure 3D:
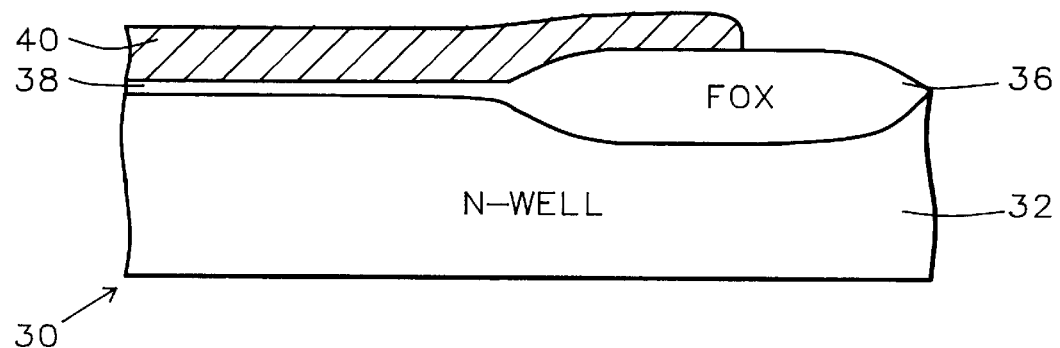

FIG. 3D shows the device 30 of FIG. 3C with the sacrificial polysilicon oxide layer 44 stripped from the device 30 carrying away the unwanted fluoride atoms trapped in the layer 44. The polysilicon oxide (SAC-OX) layer 44 is stripped away by means of etching in a (Buffered Oxide Etchant) BOE oxide removal step which strips away all of SAC-OX layer 44. The etching process is selected from dry plasma oxide etching and the group consisting of wet etching selected from BOE, HF. Any loss from the FOX region 36 can be ignored for a short wet dip.

The conditions for etching with each of the different etchants are as follows:

For a BOE aqueous solution of 50:1, the etch rate of the silicon dioxide is 150 Å/min. at 23° C.

For an HF aqueous solution of 50:1, the etch rate of the silicon dioxide is 60 Å/min. at 23° C.

For the process of plasma oxide etching of the silicon dioxide, the power employed is 205 Watts.

Figure 3E:
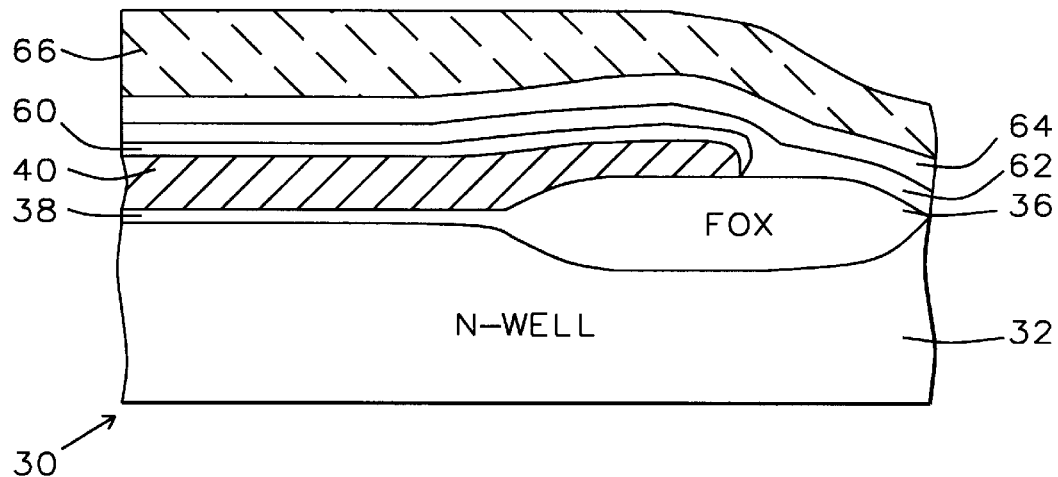

FIG. 3E shows the device 30 of FIG. 3D with a new (dielectric) layer 60 of polyoxide or silicon nitride having a thickness of about 70 Å.

In the case in which dielectric layer 60 comprises polyoxide, the polyoxide layer 60 is next covered with a silicon nitride layer 62 about 400 Å thick. Next, over silicon nitride layer 62 is formed an silicon oxide layer 64 formed from an O$_3$-TEOS material. Above layer 64, a glass layer 66, from about 200 Å to about 600 Å thick is formed. Layer 66 is composed of BPSG or BPTEOS.

After the step shown in FIG. 3E, the concentration of the boron dopant in the polysilicon layer 40 ranges from about 1.4 E 20 atoms/cm$^3$ to about 1.7 E 21 atoms/cm$^3$. The concentration of the fluorine atoms in the polysilicon layer 40 ranges from about 2.8 E 20 atoms/cm$^3$ to about 3.4 E 21 atoms/cm$^3$, so damage to the device due to evolution of fluorine gas from layer 40 during manufacture is avoided.

FIGS. 4A–4E show a sectional view across the width of the control gate electrode, orthogonal to the sectional views of FIGS. 3A–3E of the steps of fabrication of a device 30 in accordance with this invention.

Figure 4A:
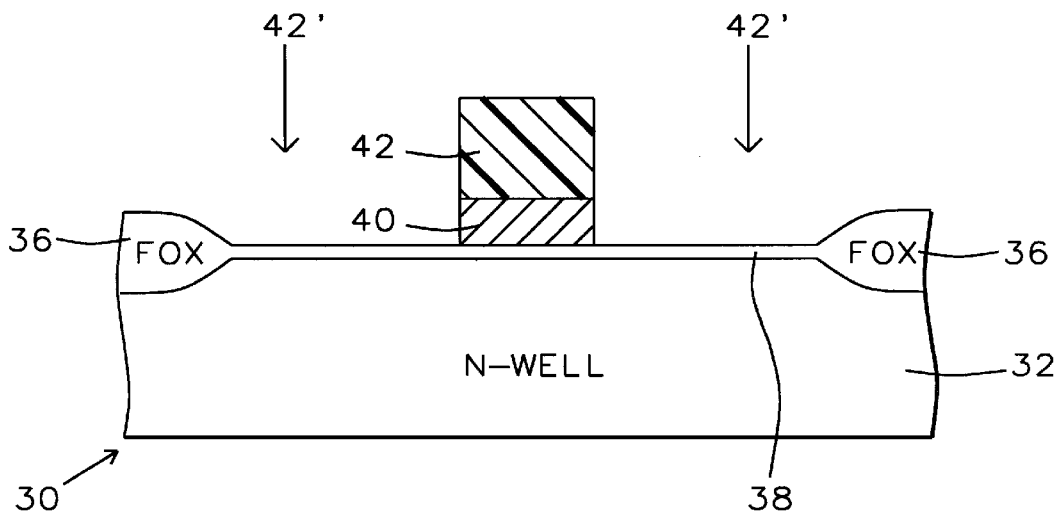
FIGS. 4A–4E show a sectional view across the width of the control gate electrode, orthogonal to the sectional views of FIGS. 3A–3E of the steps of fabrication of a device in accordance with this invention.

FIG. 4A shows the device 30 in an early stage of manufacture with gate oxide layer 38 and a field oxide (FOX) region 36 formed on the surface of N-well 32. A blanket layer of polycrystalline silicon (polysilicon) 40 has been formed over the device and a photoresist mask 42 with a pair of openings 42' is shown over the polysilicon layer 40. The polysilicon layer 40 has been etched to form a control gate electrode over gate oxide layer 38.

Figure 4B:
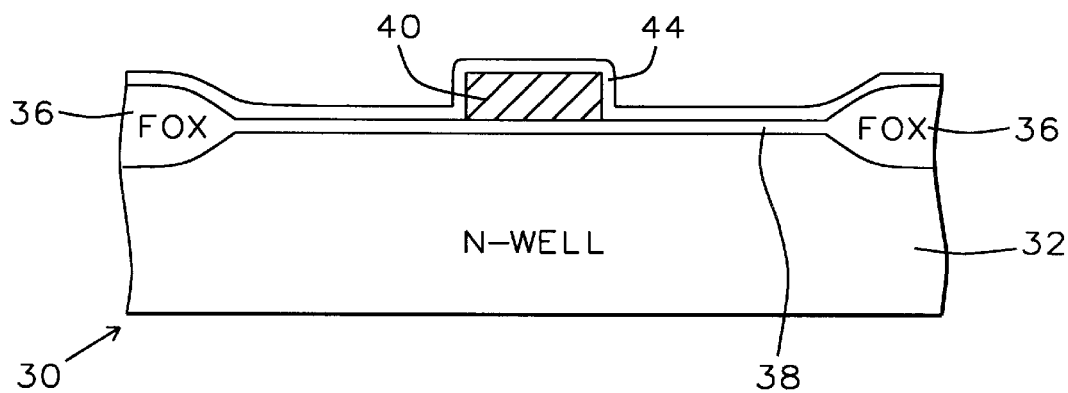

FIG. 4B shows the device 30 of FIG. 4A after the mask 42 has been stripped from the device 30 which is shown after formation of the SAC-OX layer 44 in accordance with this invention which covers the layer 40 and extends over the edge of layer 40 to cover both the gate oxide layer 38 and the surface of FOX region 36.

Figure 4C:
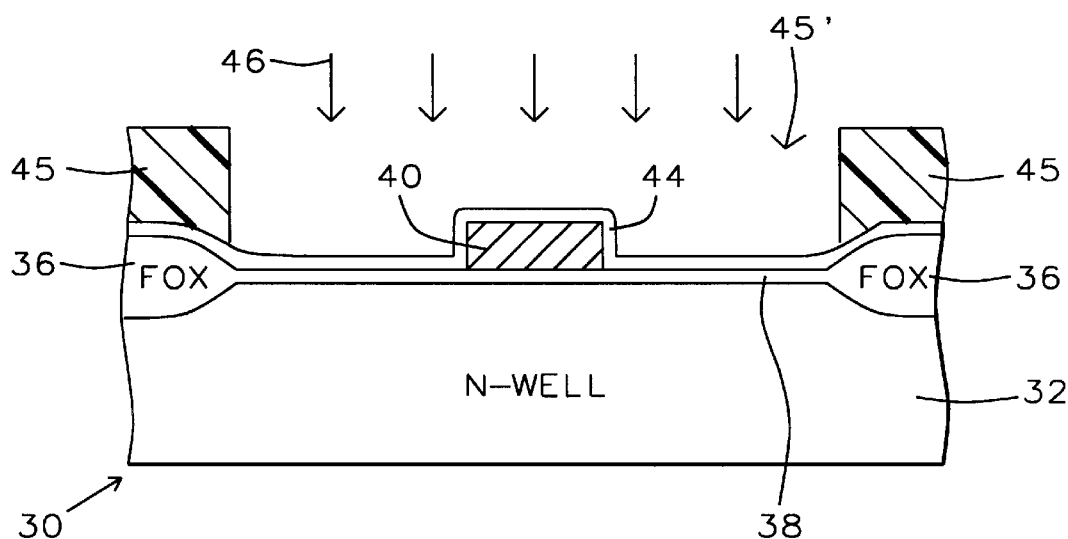

FIG. 4C shows the device 30 of FIG. 4B during the source/drain ion implantation process, with the polysilicon layer 40 and the SAC-OX layer 44 being exposed to ion implantation with P-type dopant with a dose of ions of boron fluoride $^{49}(BF_2)^+$ dopant 46.

The process of ion implantation is performed at an energy from about 60 keV to about 80 keV of from about 1 E 15 ions/cm$^2$ to about 5 E 15 ions/cm$^2$.

Figure 4D:
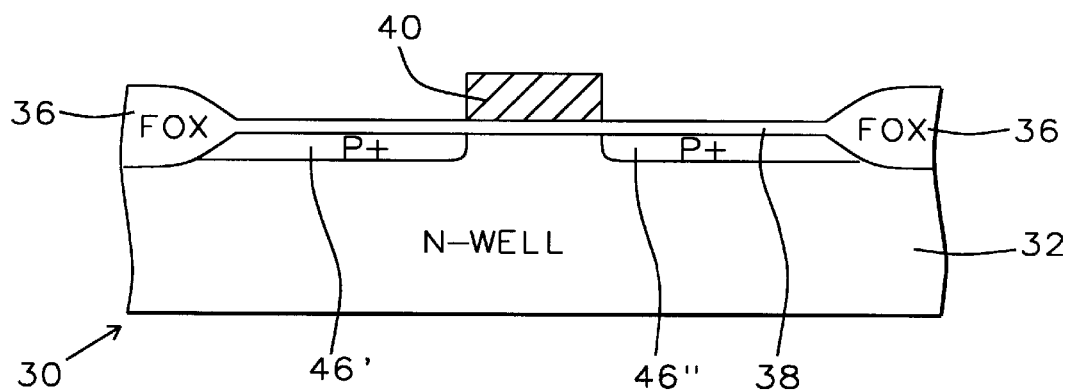

FIG. 4D shows the device 30 of FIG. 4C with the newly formed source/drain regions 46'/46". In addition the SAC-OX layer 44 has been stripped from the device 30 carrying away the unwanted fluoride atoms trapped in the layer 44.

Figure 4E:
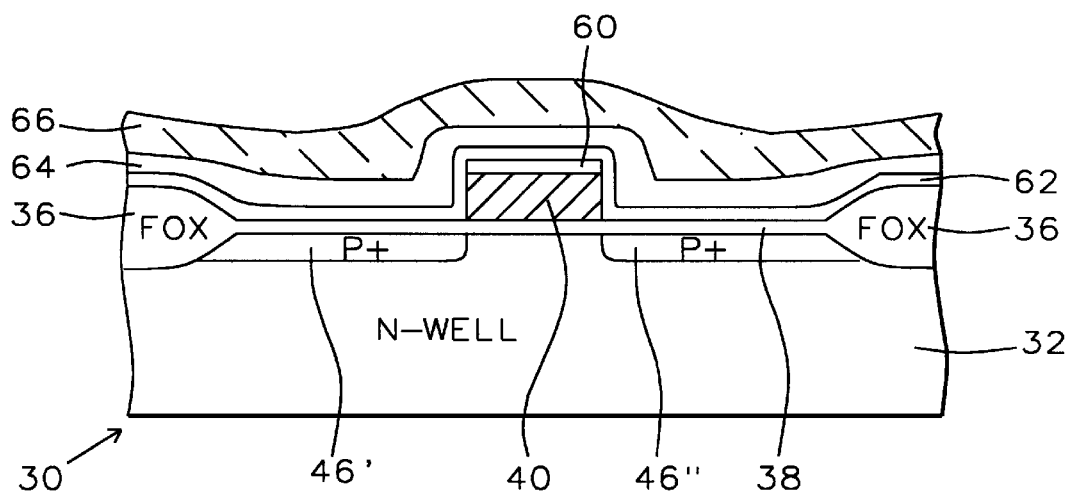

FIG. 4E shows the device 30 of FIG. 4D with the new CA (Capacitor) layer 60 of silicon dioxide formed over the control gate electrode 40.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method for manufacturing integrated circuit semiconductor device which comprises said steps of:

providing a semiconductor substrate with an N-well therein, forming a field oxide and a gate oxide layer on said N-well, forming a blanket polysilicon layer over said field oxide and said gate oxide layer and patterning said polysilicon layer to form a polysilicon gate electrode, forming a blanket sacrificial silicon oxide layer over said polysilicon gate electrode and over said gate oxide layer, ion implanting boron difluoride $^{49}(BF_2)^+$ ions into said polysilicon gate electrode and into said N-well self-aligned with said polysilicon gate electrode and to dope said polysilicon gate electrode with P-type dopant thereby forming doped regions in said N-well and in said polysilicon gate electrode, said boron fluoride $^{49}(BF_2)^+$ dopant is ion implanted at an energy from about 60 keV to about 80 keV and a dose from about 1 E 15 ion/cm$^2$ to about 5 E 15 ions/cm$^2$, said sacrificial silicon oxide layer preventing delamination of subsequent dielectric layers by removing fluorine gas from said polysilicon gate electrode, etching said blanket sacrificial silicon oxide layer away from said device, after etching said blanket sacrificial silicon oxide layer away from said device, forming a dielectric structure over said device by the steps as follows:

form a first layer comprising a polyoxide layer on said polysilicon gate electrode, form a second layer comprising a blanket silicon nitride layer on said device covering said first layer, form a third layer comprising a blanket silicon oxide layer composed of O$_3$-TEOS material on said device covering said second layer, and form a fourth layer comprising a blanket BPSG layer on said device covering said third layer.

2. The method of claim 1 wherein:

said first layer consisting of polyoxide has a thickness of about 70 Å;

said second layer consisting of silicon nitride has a thickness of about 400 Å, said third layer consisting of an O$_3$ TEOS material, and said glass layer is composed of a material selected from the group consisting of BPSG and BPTEOS having a thickness of about 200 Å to about 600 Å.

3. The method of claim 2 wherein:

concentration of said boron dopant in said polysilicon gate electrode ranges from about 1.4 E 20 atoms/cm$^3$ to about 1.7 E 21 atoms/cm$^3$ and said concentration of said fluorine atoms in said polysilicon gate electrode ranges from about about 2.8 E 20 atoms/cm$^3$ to about 3.4 E 21 atoms/cm$_3$, and before etching said sacrificial layer polysilicon oxide away said concentration of said boron dopant in said polysilicon oxide ranges from about 1.4 E 20 atoms/cm$^2$ to about 1.7 E 21 atoms/cm$^3$ and said concentration of said fluorine atoms in said polysilicon oxide layer ranges from about 2.8 E 20 atoms/cm$^3$ to about 3.4 E 21 atoms/cm$^3$.

* * * * *